(12) United States Patent
Kim et al.

(10) Patent No.: US 8,981,208 B2
(45) Date of Patent: Mar. 17, 2015

(54) SOLAR CELL

(75) Inventors: Sungjin Kim, Seoul (KR); Gyeayoung Kwag, Seoul (KR); Younggu Do, Seoul (KR); Mann Yi, Seoul (KR); Seongeun Lee, Seoul (KR); Youngsung Yang, Seoul (KR); Taeyoung Kwon, Seoul (KR); Haejong Cho, Seoul (KR); Minho Choi, Seoul (KR); Juhwa Cheong, Seoul (KR)

(73) Assignee: LG Electronics Inc., Seoul (KR)

(*) Notice: Subject to any disclaimer, the term of this patent is extended or adjusted under 35 U.S.C. 154(b) by 547 days.

(21) Appl. No.: 13/160,917

(22) Filed: Jun. 15, 2011

(65) Prior Publication Data

US 2011/0308601 A1   Dec. 22, 2011

(30) Foreign Application Priority Data

Jun. 21, 2010 (KR) .................. 10-2010-0058658
Jun. 21, 2010 (KR) .................. 10-2010-0058659

(51) Int. Cl.
*H01L 31/00* (2006.01)
*H01L 31/0224* (2006.01)
*H01L 31/068* (2012.01)

(52) U.S. Cl.
CPC ..... *H01L 31/022425* (2013.01); *H01L 31/022433* (2013.01); *H01L 31/068* (2013.01); *Y02E 10/52* (2013.01); *Y02E 10/547* (2013.01)
USPC .............. 136/256; 257/E21.125; 438/98

(58) Field of Classification Search
CPC .............................. H01L 31/022425
USPC .......................................... 136/256
See application file for complete search history.

(56) References Cited

U.S. PATENT DOCUMENTS

| | | | |
|---|---|---|---|
| 4,152,824 A | 5/1979 | Gonsiorawski | |
| 5,181,968 A * | 1/1993 | Nath et al. | 136/256 |
| 5,661,041 A | 8/1997 | Kano | |
| 2007/0209697 A1 | 9/2007 | Karakida et al. | |
| 2008/0121266 A1 * | 5/2008 | Tsunomura et al. | 136/244 |
| 2008/0196757 A1 * | 8/2008 | Yoshimine | 136/244 |
| 2009/0194151 A1 * | 8/2009 | Ishikawa et al. | 136/252 |
| 2009/0239331 A1 | 9/2009 | Xu et al. | |
| 2010/0018577 A1 * | 1/2010 | Nishiwaki et al. | 136/256 |
| 2010/0132792 A1 | 6/2010 | Kim et al. | |
| 2010/0170568 A1 | 7/2010 | Kawaguchi | |
| 2010/0243024 A1 * | 9/2010 | Hashimoto et al. | 136/244 |

FOREIGN PATENT DOCUMENTS

| | | |
|---|---|---|
| JP | 5-63218 A | 3/1993 |
| JP | 6-318724 A | 11/1994 |
| JP | 2004-235276 A | 8/2004 |

(Continued)

*Primary Examiner* — Allison Bourke
(74) *Attorney, Agent, or Firm* — Birch, Stewart, Kolasch & Birch, LLP (57) ABSTRACT

A solar cell and a method for manufacturing the same are discussed. The solar cell includes a substrate of a first conductive type, an emitter layer of a second conductive type opposite the first conductive type, a plurality of first electrodes connected to the emitter layer, at least one first current collector connected to the plurality of first electrodes, and a second electrode connected to the substrate. The emitter layer forms a p-n junction along with the substrate. Each of the plurality of first electrodes has a multi-layered structure, and the at least one first current collector has a single-layered structure.

10 Claims, 6 Drawing Sheets

(56) References Cited

FOREIGN PATENT DOCUMENTS

| JP | 2005-353691 A | 12/2005 |
| JP | 2007-234884 A | 9/2007 |
| JP | 2010-10245 A | 1/2010 |
| JP | 2010-27778 A | 2/2010 |
| KR | 10-2010-0011945 A | 2/2010 |
| KR | 10-2010-0056114 A | 5/2010 |
| WO | WO 2009/041182 A1 | 4/2009 |
| WO | WO 2010/001473 A1 | 1/2010 |

\* cited by examiner

SOLAR CELL

This application claims priority to and the benefit of Korean Patent Application No. 10-2010-0058658 and Korean Patent Application No. 10-2010-0058659 filed in the Korean Intellectual Property Office on Jun. 21, 2010, the entire contents of which are incorporated herein by reference.

BACKGROUND OF THE INVENTION

1. Field of the Invention

Embodiments of the invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductive types, such as a p-type and an n-type, and form a p-n junction, and electrodes respectively connected to the semiconductor parts of the different conductive types.

When light is incident on the solar cell, a plurality of electron-hole pairs are generated in the semiconductor parts. The electron-hole pairs are separated into electrons and holes by the photovoltaic effect. Thus, the separated electrons move to the n-type semiconductor part and the separated holes move to the p-type semiconductor part, and then the electrons and holes are collected by the electrodes electrically connected to the n-type semiconductor part and the p-type semiconductor part, respectively. The electrodes are connected to each other using electric wires to thereby obtain electric power.

SUMMARY OF THE INVENTION

In one aspect, there is a solar cell including a substrate of a first conductive type, an emitter layer of a second conductive type opposite the first conductive type, the emitter layer configured to form a p-n junction along with the substrate, a plurality of first electrodes connected to the emitter layer, each of the plurality of first electrodes having a multi-layered structure, at least one first current collector that is connected to the plurality of first electrodes and has a single-layered structure, and a second electrode connected to the substrate.

Each of the plurality of first electrodes may include a first electrode layer and a second electrode layer on the first electrode layer. The first electrode layer and the second electrode layer may be formed of different materials or the same material.

The at least one first current collector may be formed of the same material as the first electrode layer. The at least one first current collector may be formed of the same material as the second electrode layer.

For example, the first electrode layer may contain silver (Ag), and the second electrode layer may contain at least one selected from the group consisting of nickel (Ni), copper (Cu), aluminum (Al), tin (Sn), zinc (Zn), indium (In), titanium (Ti), gold (Au), and a combination thereof.

The plurality of first electrodes and the at least one first current collector may contain silver (Ag). A silver content of the first electrode layer may be different from a silver content of the second electrode layer. A silver content of the at least one first current collector may be substantially equal to the silver content of the first electrode. In this instance, the silver content of the first electrode layer and the silver content of the at least one first current collector may be greater than the silver content of the second electrode layer.

Alternatively, a silver content of the first electrode layer may be different from a silver content of the second electrode layer, and a silver content of the at least one first current collector may be substantially equal to the silver content of the second electrode. In this instance, the silver content of the first electrode layer may be greater than the silver content of the second electrode layer and the silver content of the at least one first current collector.

A width of the first electrode layer may be about 30 μm to 100 μm. A thickness of the first electrode layer may be about 10 μm to 35 μm.

The second electrode layer may be positioned only on the first electrode layer or may be positioned on the first electrode layer and the at least one first current collector.

The first electrode layer may be positioned only under the second electrode layer or may be positioned under the second electrode layer and the at least one first current collector.

In another aspect, there is a method for manufacturing an electrode of a solar cell including printing a first paste on a first region of a semiconductor substrate to form a first electrode layer pattern in a first direction, and printing a second paste on the first region of the semiconductor substrate, in which the first electrode layer pattern is formed, to simultaneously form a second electrode layer pattern right on the first electrode layer pattern and a first current collector pattern in a second direction perpendicular to the first direction.

The first electrode layer pattern of the first direction may not be formed at a location overlapping the first current collector pattern of the second direction.

In yet another aspect, there is a method for manufacturing an electrode of a solar cell including printing a first paste on a first region of a semiconductor substrate to simultaneously form a first electrode layer pattern in a first direction and a first current collector pattern in a second direction perpendicular to the first direction, and printing a second paste on the first electrode layer pattern to form a second electrode layer pattern.

The second electrode layer pattern may not be formed at a location overlapping the first current collector pattern.

The first paste and the second paste may be formed of the same material. In this instance, the first paste and the second paste may contain silver (Ag), and a silver content of the first paste may be greater than a silver content of the second paste.

The first paste and the second paste may be formed of different materials. In this instance, the first paste may contain silver (Ag), and the second paste may contain at least one selected from the group consisting of nickel (Ni), copper (Cu), aluminum (Al), tin (Sn), zinc (Zn), indium (In), titanium (Ti), gold (Au), and a combination thereof.

The method may further include forming a second electrode pattern and a second current collector pattern in a second region of the semiconductor substrate.

The forming of the second electrode pattern and the second current collector pattern may include screen-printing a paste of substantially the same material as the second paste on the second region of the semiconductor substrate.

According to the above-described characteristics, because each of the plurality of first electrodes has a double-layered structure including the first electrode layer and the second electrode layer, the thickness of the first electrode having the double-layered structure is greater than a thickness of a first electrode having a single-layered structure. Thus, a serial resistance of the first electrode is reduced, and a carrier transfer efficiency from the emitter layer to the first electrodes is improved. As a result, the efficiency of the solar cell is improved.

Further, because a portion of the first electrode contacting the emitter layer contains silver, a contact resistance between the emitter layer and the first electrode is reduced. Hence, the carrier transfer efficiency from the emitter layer to the first electrodes is improved. As a result, the efficiency of the solar cell is improved.

Further, because the second electrode layer is formed using a conductive material that is more inexpensive than silver, an amount of silver paste used decreases. Thus, the manufacturing cost of the solar cell is reduced.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

A solar cell according to an example embodiment of the invention is described below with reference to FIGS. 1 and 2.

Figure 1:
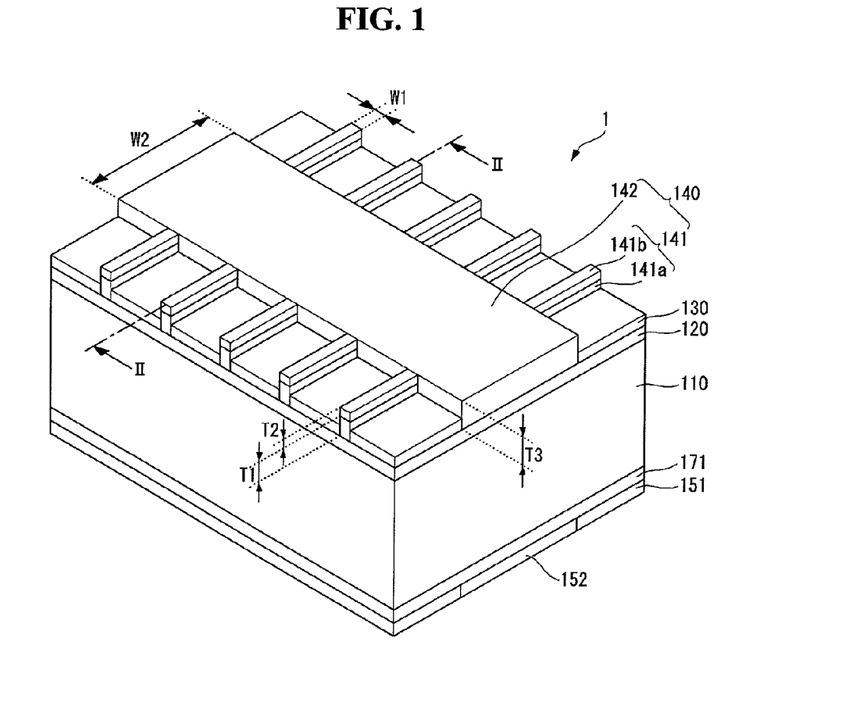
FIG. 1 is a partial perspective view of a solar cell according to an example embodiment of the invention.

FIG. 1 is a partial perspective view of a solar cell according to an example embodiment of the invention. FIG. 2 is a cross-sectional view taken along line II-II of FIG. 1.

Figure 2:
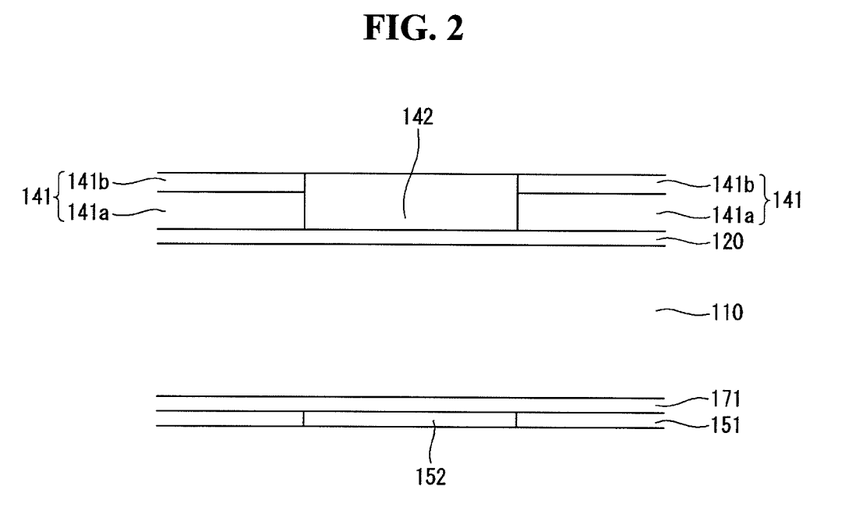
FIG. 2 is a cross-sectional view taken along line II-II of FIG. 1.

As shown in FIGS. 1 and 2, a solar cell 1 according to an example embodiment of the invention includes a substrate 110, an emitter layer 120 positioned at a light receiving surface of the substrate 110 on which light is incident, a plurality of first electrodes 141 positioned on the emitter layer 120, at least one first current collector 142 positioned on the emitter layer 120 in a direction crossing the plurality of first electrodes 141, an anti-reflection layer 130 positioned on the emitter layer 120 on which the plurality of first electrodes 141 and the at least one first current collector 142 are not positioned, and a second electrode 151 that is positioned on a surface opposite the light receiving surface of the substrate 110 and is connected to the substrate 110.

The substrate 110 is a semiconductor substrate, and may be formed of silicon of a first conductive type, for example, p-type, though not required. Silicon used in the substrate 110 may be single crystal silicon, polycrystalline silicon, or amorphous silicon. When the substrate 110 is of a p-type, the substrate 110 may contain impurities of a group III element such as boron (B), gallium (Ga), and indium (In).

The surface of the substrate 110 may be textured to form a textured surface corresponding to an uneven surface or having uneven characteristics. If the surface of the substrate 110 is the textured surface, a light reflectance at the light receiving surface of the substrate 110 may be reduced. Further, because both a light incident operation and a light reflection operation may be performed on the textured surface of the substrate 110, light may be confined in the solar cell 1. Hence, light absorption may increase, and the efficiency of the solar cell 1 may be improved. In addition, because a reflection loss of light incident on the substrate 110 may decrease, an amount of light incident on the substrate 110 may further increase.

The emitter layer 120 is a region doped with impurities of a second conductive type (for example, an n-type) opposite the first conductive type (for example, p-type) of the substrate 110. The emitter layer 120 forms a p-n junction along with the substrate 110. When the emitter layer 120 is of the n-type, the emitter layer 120 may be formed by doping the substrate 110 with impurities of a group V element such as phosphorus (P), arsenic (As), and antimony (Sb).

When energy of light incident on the substrate 110 is applied to atoms inside the substrate 110, electron-hole pairs are produced thereby. The electrons then move to the n-type semiconductor, and the holes then move to the p-type semiconductor. Thus, when the substrate 110 is of the p-type and the emitter layer 120 is of the n-type, the holes move to the p-type substrate 110 and the electrons move to the n-type emitter layer 120.

Unlike the embodiment of the invention, the substrate 110 may be of an n-type and may be formed of semiconductor materials other than silicon. When the substrate 110 is of the n-type, the substrate 110 may contain impurities of a group V element such as phosphorus (P), arsenic (As), and antimony (Sb).

Because the emitter layer 120 forms the p-n junction along with the substrate 110, the emitter layer 120 is of the p-type when the substrate 110 is of the n-type. In this instance, electrons move to the substrate 110 and holes move to the emitter layer 120. When the emitter layer 120 is of the p-type, the emitter layer 120 may be formed by doping the substrate 110 with impurities of a group III element such as boron (B), gallium (Ga), and indium (In).

The anti-reflection layer 130 on the emitter layer 120 may be formed of silicon nitride (SiNx) and/or silicon dioxide (SiO$_2$). The anti-reflection layer 130 reduces a reflectance of light incident on the solar cell 1 and increases selectivity of a predetermined wavelength band of the incident light, thereby increasing the efficiency of the solar cell 1.

FIGS. 1 and 2 show the anti-reflection layer 130 having a single-layered structure. However, the anti-reflection layer 130 may have a multi-layered structure such as a double-layered structure and a triple-layered structure. The anti-reflection layer 130 may be omitted, if desired.

Each of the plurality of first electrodes 141 includes a first electrode layer 141a, that is connected to the emitter layer 120 and is formed of a conductive material, and a second electrode layer 141b positioned on the first electrode layer 141a. The first electrode layer 141a and the second electrode layer 141b on the first electrode layer 141a have the same plane shape. For example, the first electrode layer 141a and the second electrode layer 141b on the first electrode layer 141a have the same shape when viewed from above.

Accordingly, most of carriers (for example, electrons) moving to the emitter layer 120 are collected by the plurality of first electrode layers 141a, and at least a portion of the collected carriers move to the second electrode layers 141b connected to the first electrode layers 141a.

The first electrode layers 141a and the second electrode layers 141b may be formed of the same conductive material. Alternatively, the first electrode layers 141a and the second electrode layers 141b may be formed of different conductive materials.

In the example embodiment of the invention, the first electrodes 141 may be formed of at least one selected from the group consisting of silver (Ag), nickel (Ni), copper (Cu), aluminum (Al), tin (Sn), zinc (Zn), indium (In), titanium (Ti), gold (Au), and a combination thereof. Other materials may be used.

The first electrode layers 141a may contain silver (Ag) having good conductivity, and the second electrode layers 141b may contain nickel (Ni), copper (Cu), aluminum (Al), etc. Thus, because a contact resistance between the emitter layer 120 and the plurality of first electrode layers 141a is reduced, a carrier transfer efficiency from the emitter layer 120 to the first electrode layers 141a is improved.

In the example embodiment of the invention, because each of the plurality of first electrodes 141 has a double-layered structure including the first electrode layer 141a and the second electrode layer 141b, a thickness of the first electrode 141 having the double-layered structure may be greater than a thickness of a first electrode having a single-layered structure. Hence, a serial resistance of the solar cell 1 is reduced, and a carrier transfer efficiency from the emitter layer 120 to the first electrodes 141 is improved. Further, a current loss is reduced.

In the example embodiment of the invention, each of the first electrodes 141 may have a width W1 of about 30 μm to 100 μm. Further, each of the first electrode layers 141a may have a thickness T1 of about 15 μm to 30 μm, and each of the second electrode layers 141b may have a thickness T2 of about 40 μm to 50 μm.

When the width W1 of the first electrodes 141 is less than about 30 μm, a disconnection may be generated in the first electrodes 141. When the width W1 of the first electrodes 141 is greater than about 100 μm, a light receiving area of the solar cell 1 may decrease. Hence, the efficiency of the solar cell 1 may be reduced.

The at least one first current collector 142 on the emitter layer 120 may be referred to as a bus bar. The at least one first current collector 142 extends in the direction crossing the plurality of first electrodes 141. Further, the at least one first current collector 142 is connected to the first electrode layers 141a and the second electrode layers 141b.

The at least one first current collector 142 may be formed of a material different from the first electrode layers 141a and the second electrode layers 141b. The cross-sectional view of the solar cell 1 having the above-described structure is illustrated in FIG. 2. A thickness T3 of the first current collector 142 shown in FIGS. 1 and 2 may be substantially equal to or different from a thickness (T1+T2) (i.e., a sum of the thickness T1 of the first electrode layer 141a and the thickness T2 of the second electrode layer 141b) of the first electrode 141. When the thickness T3 of the first current collector 142 is different from the thickness (T1+T2) of the first electrode 141, contact portions between the first electrodes 141 and the first current collector 142 may be inclined. In this instance, the first current collector 142 may be partially connected to the plurality of first electrode layers 141a and the plurality of second electrode layers 141b through the side of the first current collector 142. In other embodiments, the thickness T3 of the first current collector 142 may be substantially equal to one or both of the thickness T1 of the first electrode layer 141a and the thickness T2 of the second electrode layer 141b. For example, the thickness T3 of the first current collector 142 may be substantially equal to the thickness T1 of the first electrode layer 141a.

As described above, each of the plurality of first electrodes 141 has the double-layered structure including the first electrode layer 141a and the second electrode layer 141b, and the at least one first current collector 142 has a single-layered structure.

The plurality of first electrode layers 141a are spaced apart from one another and extend in a direction crossing the first current collector 142. Because the first current collector 142 extending in the direction crossing the plurality of first electrode layers 141a is positioned right on the emitter layer 120, the plurality of first electrode layers 141a are not positioned on the emitter layer 120 on which the first current collector 142 is positioned.

As above, because the first current collector 142 is connected to the plurality of first electrodes 141 and a portion of the emitter layer 120, the first current collector 142 outputs carriers (for example, electrons) transferred from the emitter layer 120 and the plurality of first electrodes 141 to an external device. In this instance, the first current collector 142 collects the carriers from the first electrode layers 141a as well as the second electrode layers 141b. In the solar cell 1 having the above-described structure, the first electrodes 141 and the first current collector 142 may be manufactured by sequentially forming the first electrode layers 141a and the second electrode layers 141b, for example, on the anti-reflection layer 130, and then forming the first current collector 142. Alternatively, the first electrodes 141 and the first current collector 142 may be manufactured by forming the first current collector 142, for example, on the anti-reflection layer 130, and then sequentially forming the first electrode layers 141a and the second electrode layers 141b.

The first electrode layers 141a, the second electrode layers 141b, and the first current collector 142 may be formed of the same conductive material. In this instance, an amount of the conductive material used as a main component of the first current collector 142 may be different from the first electrode layer 141a or the second electrode layer 141b. More specifically, an amount of the conductive material of the first electrode layer 141a may be different from an amount of the conductive material of the second electrode layer 141b and an amount of the conductive material of the first current collector 142.

For example, a silver content of the first electrode layer 141a may be greater than a silver content of the second electrode layer 141b and a silver content of the first current collector 142. In other words, the silver content of the first electrode layer 141a may be about 80 wt % to 90 wt %, and the silver content of the second electrode layer 141b and the silver content of the first current collector 142 may be about 70 wt % to 75 wt %.

The solar cell 1 further includes a back surface field (BSF) layer 171 between the second electrode 151 and the substrate 110. The back surface field layer 171 is a region (e.g., a $p^+$-type region) that is doped more heavily than the substrate 110 with impurities of the same conductive type as the substrate 110. The back surface field layer 171 serves as a potential barrier of the substrate 110. Thus, the back surface field layer 171 prevents or reduces a recombination and/or a disappearance of electrons and holes around the back surface opposite the light receiving surface of the substrate 110, thereby improving the efficiency of the solar cell 1.

The second electrode 151 on the back surface of the substrate 110 collects carriers (for example, holes) moving to the substrate 110. The second electrode 151 may be formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The solar cell 1 further includes at least one second current collector 152 on the back surface of the substrate 110. The at least one second current collector 152 is connected to the second electrode 151.

In the example embodiment of the invention, the at least one second current collector 152 is positioned right on the back surface of the substrate 110 and is connected to the second electrode 151 adjacent to the at least one second current collector 152. Namely, the at least one second current collector 152 does not overlap the second electrode 151. However, other configurations may be used. For example, the at least one second current collector 152 may partially overlap the second electrode 151. Alternatively, the at least one second current collector 152 may lay over the second electrode 151 on the back surface of the substrate 110 and may be connected to the underlying second electrode 151.

In the example embodiment of the invention, the second current collector 152 is positioned (or aligned) opposite the first current collector 142 with the substrate 110 interposed therebetween and extends in the same direction as the first current collector 142. Other configurations may be used.

Although FIG. 1 as the partial perspective view of the solar cell 1 shows one second current collector 152, the solar cell 1 may include a plurality of second current collectors 152.

Similar to the first current collector 142, the second current collector 152 connected to the second electrode 151 collects carriers (for example, holes) transferred from the second electrode 151 and outputs the carriers to the external device through a conductive tape, etc.

The second current collector 152 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

Various methods of manufacturing an electrode of the solar cell according to the example embodiment of the invention are described below with reference to FIGS. 3 to 6.

FIGS. 3 to 6 illustrate four example methods of manufacturing an electrode of the solar cell according to example embodiments of the invention, respectively. More specifically, the (a)'s in respective FIGS. 3, 4, 5, and 6 are plane views of a first front electrode part pattern formed through a first printing process in each example method. The (b)'s in respective FIGS. 3, 4, 5, and 6 are plane views of a second front electrode part pattern formed through a second printing process in each example method. The (c)'s in respective FIGS. 3, 4, 5, and 6 are cross-sectional views of the first and second front electrode part patterns taken along a longitudinal direction of a first electrode layer pattern in each example method.

In the electrode fabrication methods illustrated in FIGS. 3 to 6, before the electrode is formed, the emitter layer 120 and the anti-reflection layer 130 have been formed on one surface of the substrate 110.

A method for manufacturing the emitter layer 120 is briefly described below. A high temperature thermal process of a material (for example, $POCl_3$ or $H_3PO_4$) containing, for example, impurities of a group V element such as phosphorus (P), arsenic (As), and antimony (Sb) may be performed on the p-type substrate 110 to distribute the impurities of the group V element into the substrate 110. Hence, the n-type emitter layer 120 may be formed at the entire surface of the substrate 110 including a front surface, a back surface, and lateral surfaces of the substrate 110.

Alternatively, when the substrate 110 is of an n-type unlike the above embodiment of the invention, a high temperature thermal process of a material (for example, $B_2H_6$) containing, for example, impurities of a group III element may be performed on the substrate 110 to form the p-type emitter layer 120 at the entire surface of the substrate 110.

Subsequently, phosphorous silicate glass (PSG) containing phosphorous (P) or boron silicate glass (BSG) containing boron (B) produced when p-type impurities or n-type impurities are distributed into the substrate 110 is removed through an etching process.

Next, a method for manufacturing the anti-reflection layer 130 is briefly described below. The anti-reflection layer 130 may be formed by depositing, for example, silicon nitride (SiNx) on the light receiving surface (for example, the front surface) of the substrate 110 using various deposition methods, for example, a plasma enhanced chemical vapor deposition (PECVD) method.

A refractive index of the anti-reflection layer 130 may have a value between a refractive index (about 1) of air and a refractive index (about 3.5) of the silicon substrate 110. For example, the anti-reflection layer 130 may have the refractive index of about 1.9 to 2.3. Hence, because the refractive indexes going from air to the substrate 110 via the anti-reflection layer 130 sequentially change, the anti-reflection effect of the anti-reflection layer 130 is improved.

As above, after the emitter layer 120 and the anti-reflection layer 130 are formed, the electrode is manufactured using the various methods illustrated in FIGS. 3 to 6.

Figure 3:
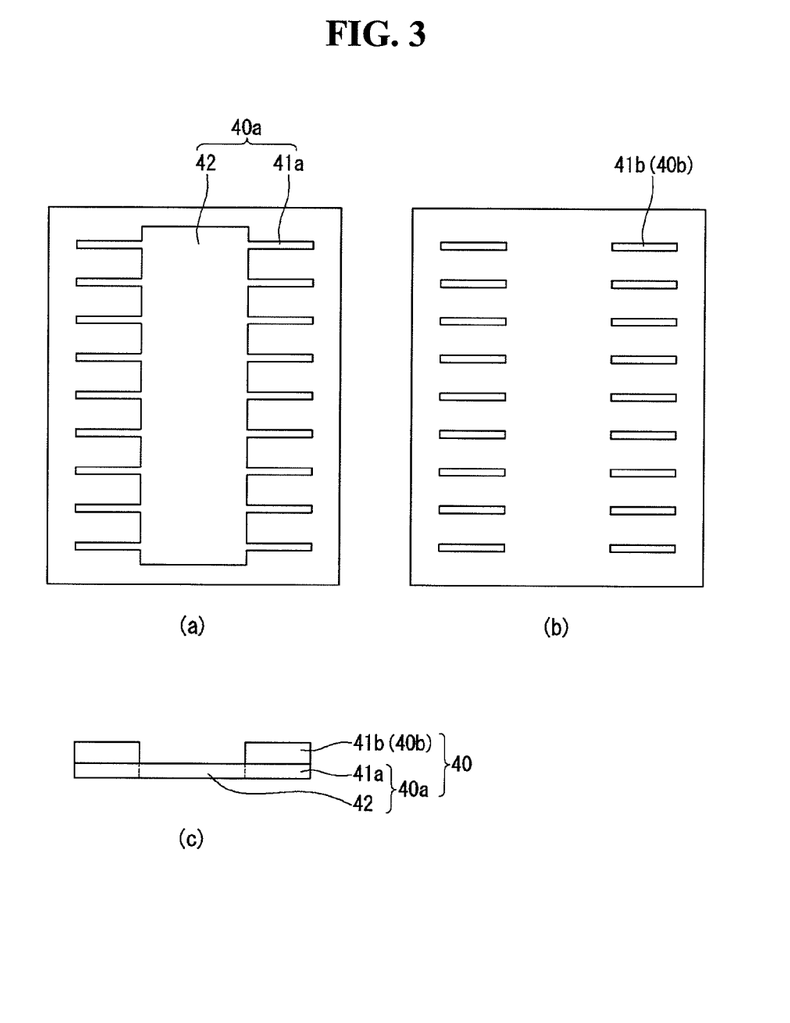
FIG. 3 relates to a first example method of manufacturing an electrode of a solar cell according to an example embodiment of the invention.

In the first example method, as shown in (a) of FIG. 3, a paste for a first front electrode part pattern is printed on the substrate 110 using a screen printing method and then is dried at a predetermined temperature, for example, about 120° C. to 200° C. to form a first front electrode part pattern 40a. The first front electrode part pattern 40a includes a first electrode layer pattern 41a and a first current collector pattern 42. The first current collector pattern 42 extends in a direction crossing the first electrode layer pattern 41a.

When the first front electrode part pattern 40a is formed using a silver paste, a contact resistance between the first front electrode part pattern 40a and the substrate 110 decreases. Hence, photoelectric conversion characteristic of the solar cell 1 may be improved.

Next, as shown in (b) of FIG. 3, a second front electrode part pattern 40b is formed. The second front electrode part pattern 40b includes a second electrode layer pattern 41b. The second electrode layer pattern 41b has the same plane shape as the first electrode layer pattern 41a. Namely, the second electrode layer pattern 41b is not formed in an area overlapping the first current collector pattern 42.

The second front electrode part pattern 40b may be formed by printing a paste containing a material different from the formation material of the first front electrode part pattern 40a on the first electrode layer pattern 41a and then drying the paste at about 120° C. to 200° C.

The paste for the second front electrode part pattern 40b may contain a conductive material different from the paste for the first front electrode part pattern 40a, for example, at least one selected from the group consisting of aluminum (Al), nickel (Ni), copper (Cu), silver (Ag), tin (Sn), zinc (Zn), indium (In), titanium (Ti), gold (Au), and a combination thereof.

The electrode formed thus has a cross-sectional shape shown in (c) of FIG. 3.

Figure 4:
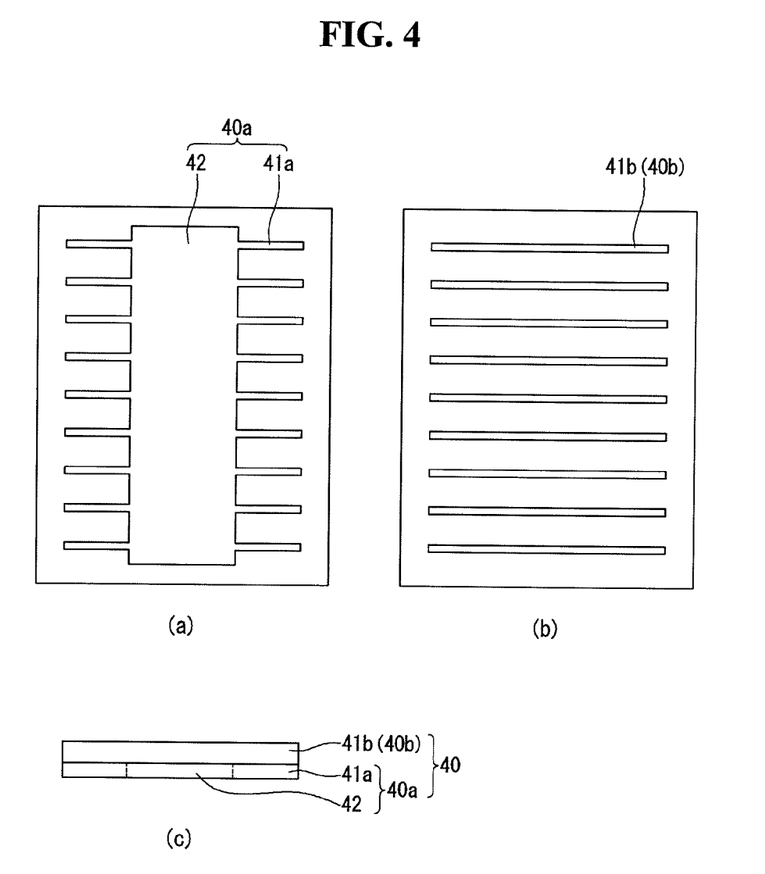
FIG. 4 relates to a second example method of manufacturing an electrode of a solar cell according to an example embodiment of the invention.

In the second example method, as shown in (b) FIG. 4, a second front electrode part pattern 40b may be continuously printed even on a formation area of a first current collector pattern 42. In this instance, because a portion of the first current collector 142 may overlap the first electrode layer 141a having the high conductivity, a contact resistance between the silicon substrate 110 and the first current collector 142 may decrease. Hence, a loss of current flowing from the first electrode 141 to the first current collector 142 may decrease, and the photoelectric conversion characteristic of the solar cell 1 may be improved.

The electrode formed thus has a cross-sectional shape shown in (c) of FIG. 4.

Figure 5:
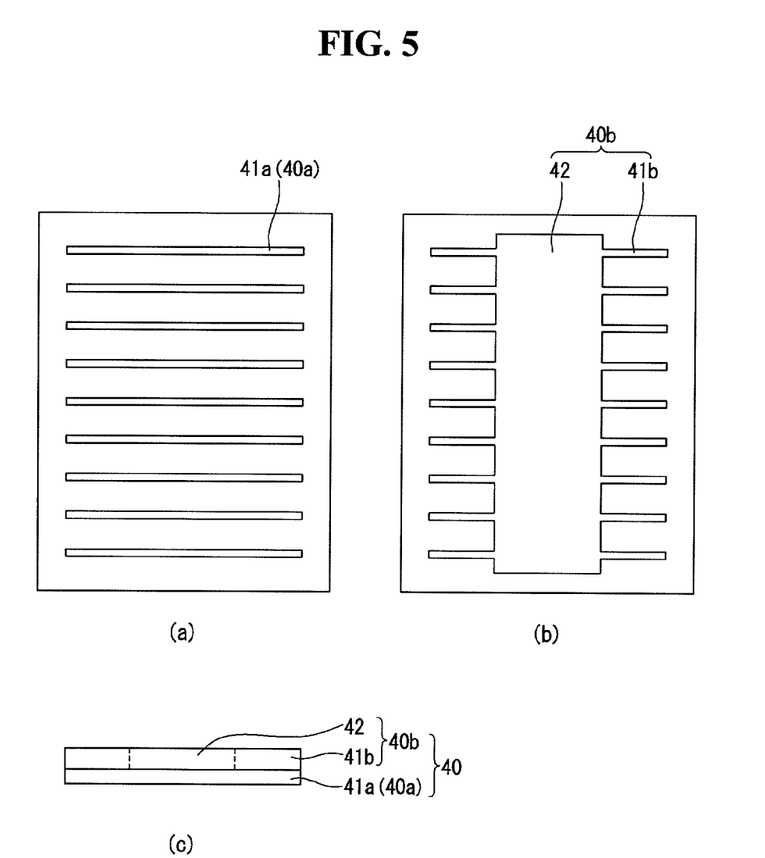
FIG. 5 relates to a third example method of manufacturing an electrode of a solar cell according to an example embodiment of the invention.

In the third example method, as shown in (a) of FIG. 5, a paste for a first front electrode part pattern is printed on the substrate 110 using a screen printing method and then is dried at a predetermined temperature, for example, about 120° C. to 200° C. to form a first front electrode part pattern 40a. The first front electrode part pattern 40a includes a first electrode layer pattern 41a but not a first current collector pattern 42. The first electrode layer pattern 41a is formed even on an area to be formed with a first current collector pattern 42. Namely, the first electrode layer pattern 41a is continuously printed even on a designated formation area of the first current collector pattern 42.

Next, as shown in (b) of FIG. 5, a second front electrode part pattern 40b is formed. The second front electrode part pattern 40b includes a second electrode layer pattern 41b and the first current collector pattern 42. The first current collector pattern 42 extends in a direction crossing the first electrode layer pattern 41a. Thus, a portion of the first electrode layer pattern 41a overlaps a portion of the first current collector pattern 42.

The electrode formed thus has a cross-sectional shape shown in (c) of FIG. 5.

Figure 6:
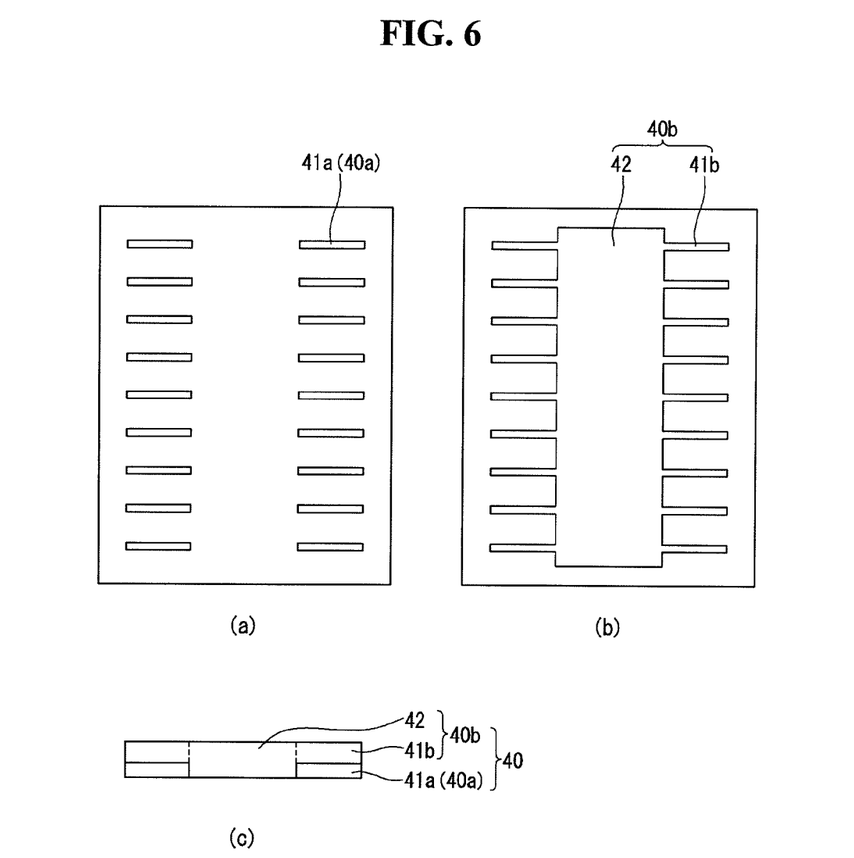
FIG. 6 relates to a fourth example method of manufacturing an electrode of a solar cell according to an example embodiment of the invention.

In the fourth example method, a first electrode layer pattern 41a may be printed in a discontinuous pattern shown in (a) of FIG. 6. Next, as shown in (b) of FIG. 6, a second front electrode part pattern 40b is formed. The second front electrode part pattern 40b includes a second electrode layer pattern 41b and a first current collector pattern 42. The first current collector pattern 42 extends in a direction crossing the first electrode layer pattern 41a. The electrode formed thus has a cross-sectional shape shown in (c) FIG. 6. However, in this embodiment, a portion of the first electrode layer pattern 41a does not overlap a portion of the first current collector pattern 42. Rather, the second electrode layer pattern 41b overlaps the first electrode layer pattern 41a.

In the example methods illustrated in FIGS. 3 to 6, because the printing process for forming a front electrode part pattern 40 is performed in two printing processes or steps, the thickness of the first electrode 141 formed by the front electrode part pattern 40 may increase, compared with the electrode formed through one printing process or step. In other embodiments of the invention, the printing process for forming a front electrode part pattern 40 is performed in three or more printing processes, for example, a process for forming the first electrode layer pattern 41a, the first current collector pattern 42, and the second electrode layer pattern 41b. In an embodiment having the three or more printing processes, forming of the first electrode layer pattern 41a should be performed prior to the forming of the second electrode layer pattern 41b, but forming of the first current collector pattern 42 may be performed as any step in the three or more printing processes, which may be performed sequentially.

In the example methods illustrated in FIGS. 3 to 6, the first electrode layer pattern 41a and the second electrode layer pattern 41b are formed of different materials. However, the paste for the first front electrode part pattern 40a and the paste for the second front electrode part pattern 40b may contain the same conductive material as a main component.

In this instance, an amount of conductive material contained as a main component in a paste for the first electrode layer pattern 41a and the first current collector pattern 42 may be different from an amount of conductive material contained as a main component in a paste for the second electrode layer pattern 41b. Namely, an amount of conductive material contained as a main component in the paste for the first front electrode part pattern 40a may be different from an amount of conductive material contained as a main component in the paste for the second front electrode part pattern 40b.

For example, a first paste, in which an amount of a silver powder is relatively high with respect to the total weight, may be printed on the anti-reflection layer 130 to form the first front electrode part pattern 40a. Then, a second paste, in which an amount of a silver powder is less than the amount of the silver powder in the first paste with respect to the total weight, may be printed on the first front electrode part pattern 40a to form the second front electrode part pattern 40b. In this instance, the amount of the silver powder in the first paste may be about 80 wt % to 90 wt % with respect to the total weight, and the amount of the silver powder in the second paste may be about 70 wt % to 75 wt % with respect to the total weight.

After the first electrode 141 is formed through the above-described method, a back electrode paste containing aluminum (Al) is applied to a region (i.e., a corresponding portion of the back surface of the substrate 110 in the embodiment of the invention) electrically separated from a printed region of the front electrode part pattern 40 using the screen printing method and then is dried to form a back electrode pattern. The second electrode 151 is formed using the back electrode pattern.

The back electrode paste may contain at least one selected from the group consisting of silver (Ag), nickel (Ni), copper (Cu), tin (Sn), zinc (Zn), indium (In), titanium (Ti), gold (Au), and a combination thereof, instead of aluminum (Al).

Next, after a second current collector paste containing, for example, aluminum (Al) is applied to a corresponding portion of the back surface of the substrate 110 using the screen printing method and then is dried to form a second current collector pattern. The second current collector 152 is formed using the second current collector pattern.

In the embodiment of the invention, at least one second current collector pattern is positioned right on the back surface of the substrate 110 and is connected to the back electrode pattern. In other words, at least one second current collector pattern does not overlap the back electrode pattern. However, other configurations may be used. For example, at least one second current collector pattern may partially overlap the back electrode pattern. At least one second current collector pattern may lay over the back electrode pattern and may be connected to the underlying back electrode pattern.

The second current collector pattern is positioned opposite the first current collector pattern 42 with the substrate 110 interposed therebetween. The second current collector pattern extends in the same direction as the first current collector pattern 42. Other configurations may be used.

The second current collector paste may contain at least one selected from the group consisting of silver (Ag), nickel (Ni), copper (Cu), tin (Sn), zinc (Zn), indium (In), titanium (Ti), gold (Au), and a combination thereof; instead of aluminum (Al). Other materials may be used.

In the embodiment of the invention, a formation order of the front electrode part pattern 40 and a back electrode part pattern (including the back electrode pattern and the second current collector pattern) may vary. Further, a formation order of the back electrode pattern and the second current collector pattern may vary.

Subsequently, the substrate 110 including the front electrode part pattern 40 and the back electrode part pattern may be fired at about 750° C. to 800° C. to form the plurality of first electrodes 141, at least one first current collector 142, the second electrode 151, at least one second current collector 152, and the back surface field layer 171.

More specifically, when a thermal process is performed, the front electrode part pattern 40 passes through the anti-reflection layer 130 underlying the front electrode part pattern 40 due to an element such as lead (Pb) contained in a glass frit of one or more components of the front electrode part pattern 40. Thus, one or more of the first electrode layer pattern 41a, the first current collector pattern 42, and the second electrode layer pattern 41b may contain lead (Pb) contained in the glass frit. In other embodiments, the second electrode layer pattern 41b need not contain lead (Pb) contained in the glass fit when the second electrode layer pattern 41b need not pass through the anti-reflection layer 130 by being formed on the first electrode layer pattern 41a and/or the first current collector pattern 42. Hence, the plurality of first electrodes 141 and the at least one first current collector 142 contacting the emitter layer 120 are formed to complete a front electrode part 140. In this instance, the first and second electrode layer patterns 41a and 41b of the front electrode part pattern 40 becomes the plurality of front electrodes 141, and the first current collector pattern 42 of the front electrode part pattern 40 becomes the at least one first current collector 142.

Further, the back electrode pattern and the second current collector pattern are the second electrode 151 and the second current collector 152 in the thermal process, respectively. Aluminum (Al) contained in the second electrode 151 and the second current collector 152 is distributed into the substrate 110 contacting the second electrode 151 to form the back surface field layer 171 between the second electrode 151 and the substrate 110. In other words, the back surface field layer 171 is formed by distributing aluminum (Al) into the back surface of the substrate 110.

Unlike an embodiment of the invention, the second current collector 152 may be formed under the second electrode 151 so as to be connected to a lower part of the second electrode 151 in another embodiment of the invention.

Next, an edge isolation process for removing the emitter layer 120 formed at the side or edges of the substrate 110 is performed, for example, by using a laser beam. Finally, the solar cell 1 shown in FIGS. 1 and 2 is completed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
    a substrate of a first conductive type;
    an emitter layer of a second conductive type opposite the first conductive type, the emitter layer configured to form a p-n junction along with the substrate;
    a plurality of first electrodes connected to the emitter layer, each of the plurality of first electrodes having a multi-layered structure;
    at least one first current collector that is connected to the plurality of first electrodes and has a single-layered structure; and
    a second electrode connected to the substrate,
    wherein each of the plurality of first electrodes includes a first electrode layer and a second electrode layer on the first electrode layer,
    wherein a portion of the at least one first current collector overlaps with a portion of the first electrode layer,
    wherein the portion of the at least one first current collector is positioned on the portion of the first electrode layer,
    wherein the first electrode layer is positioned between the substrate and the second electrode layer, and between the substrate and the at least one first current collector,
    wherein the first electrode layer is in direct contact with the second electrode layer and the at least one first current collector,
    wherein the plurality of first electrodes and the at least one first current collector contain silver (Ag), a silver content of the first electrode layer is different from a silver content of the second electrode layer, and a silver content of the at least one first current collector is substantially equal to the silver content of the second electrode layer, and
    wherein the silver content of the first electrode layer is greater than the silver content of the second electrode layer and the silver content of the at least one first current collector.

2. The solar cell of claim 1, wherein the first electrode layer and the second electrode layer are formed of different materials.

3. The solar cell of claim 1, wherein the first electrode layer and the second electrode layer are formed of the same material.

4. The solar cell of claim 1, wherein the at least one first current collector is formed of the same material as the first electrode layer.

5. The solar cell of claim 1, wherein the at least one first current collector is formed of the same material as the second electrode layer.

6. The solar cell of claim 1, wherein the first electrode layer contains silver (Ag).

7. The solar cell of claim 1, wherein the second electrode layer contains at least one selected from the group consisting of nickel (Ni), copper (Cu), aluminum (Al), tin (Sn), zinc (Zn), indium (In), titanium (Ti), gold (Au), and a combination thereof.

8. The solar cell of claim 1, wherein a width of the first electrode layer is about 30 μm to 100 μm.

9. The solar cell of claim 1, wherein a thickness of the first electrode layer is about 10 μm to 35 μm.

10. The solar cell of claim 1, wherein the first electrode layer is continuously formed under the second electrode layer and the at least one first current collector.

* * * * *